(12) United States Patent
Adams et al.

(10) Patent No.: US 6,602,652 B2
(45) Date of Patent: *Aug. 5, 2003

(54) ANTIREFLECTIVE COATING COMPOSITIONS AND EXPOSURE METHODS UNDER 200 NM

(75) Inventors: Timothy G. Adams, Sudbury, MA (US); Edward K. Pavelchek, Stow, MA (US); Roger F. Sinta, Woburn, MA (US); Manuel DoCanto, Stoughton, MA (US); Robert F. Blacksmith, Hubbardston, MA (US); Peter Trefonas, III, Medway, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/126,636

(22) Filed: Apr. 20, 2002

(65) Prior Publication Data

US 2002/0172896 A1 Nov. 21, 2002

Related U.S. Application Data

(63) Continuation of application No. 09/153,575, filed on Sep. 15, 1998, now Pat. No. 6,410,209.

(51) Int. Cl.$^7$ .............................. G03C 5/00; G03F 7/26; G03F 7/09
(52) U.S. Cl. ...................... 430/311; 430/325; 430/326; 430/330; 430/510; 430/512; 430/514
(58) Field of Search ................................ 430/311, 325, 430/326, 330, 510, 512, 514

(56) References Cited

U.S. PATENT DOCUMENTS

| | | | |
|---|---|---|---|
| 4,060,656 A | 11/1977 | Naka et al. ................. 428/355 |
| 4,362,809 A | 12/1982 | Chen et al. ................. 430/312 |
| 4,370,405 A | 1/1983 | O'Toole et al. ............. 430/312 |
| 4,551,409 A | 11/1985 | Gulla et al. ................. 430/192 |
| 4,576,898 A | 3/1986 | Hoffmann et al. .......... 430/306 |
| 4,910,122 A | 3/1990 | Arnold et al. .............. 430/313 |
| 5,498,748 A | 3/1996 | Urano et al. ................. 560/67 |
| 5,525,457 A | 6/1996 | Nemoto et al. ............. 430/325 |
| 5,541,037 A | 7/1996 | Hatakeyama et al. .... 430/273.1 |
| 5,569,784 A | 10/1996 | Watanabe et al. ........... 564/430 |
| 5,597,868 A | 1/1997 | Kunz .......................... 525/154 |
| 5,607,824 A | 3/1997 | Fahey et al. ................. 430/510 |
| 5,677,112 A | 10/1997 | Urano et al. ................. 430/325 |
| 5,759,755 A | 6/1998 | Park et al. ................... 430/512 |
| 5,891,959 A | 4/1999 | Kunz .......................... 525/107 |
| 6,410,209 B1 * | 6/2002 | Adams et al. .............. 430/311 |

FOREIGN PATENT DOCUMENTS

| | | |
|---|---|---|
| EP | 0 524 008 A1 | 5/1993 |
| EP | 0 813 114 A2 | 12/1997 |
| WO | WO 90/03598 | 4/1990 |
| WO | WO 98/14832 | 4/1998 |

OTHER PUBLICATIONS

Xu et al., "New Antireflective Coatings for 193nm Lithography", SPIE, vol. 3333, pp. 524–531, 1998.

* cited by examiner

Primary Examiner—Christopher G. Young
(74) Attorney, Agent, or Firm—Peter F. Corless; Darryl P. Frickey; Edwards & Angell, LLP

(57) ABSTRACT

The invention provides new light absorbing crosslinking compositions suitable for use as an antireflective composition (ARC), particularly suitable for short wavelength imaging applications such as 193 nm. The ARCs of the invention are preferably used with an overcoated resist layer (i.e. bottom layer ARCs) and in general comprise novel ARC resin binders that can effectively absorb reflected sub-200 nm exposure radiation.

19 Claims, No Drawings

ANTIREFLECTIVE COATING COMPOSITIONS AND EXPOSURE METHODS UNDER 200 NM

This is a continuation of application Ser. No. 09/153,575 filed on Sep. 15, 1998, now U.S. Pat. No. 6,410,209.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions ("ARCs") that contain a resin binder components that effectively absorbs short-wavelength exposure radiation, including sub-200 nm radiation such as 193 nm radiation.

2. Background

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, *Photoresist Materials and Processes*, McGraw Hill Book Company, New York, ch. 2, 1975 and by Moreay, *Semiconductor Lithography, Principles, Practices and Materials*, Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity. Variations in substrate topography also give rise to resolution-limiting reflection problems.

With recent trends towards high-density semiconductor devices, there is a movement in the industry to shorten the wavelength of exposure sources to deep ultraviolet (DUV) light (300 nm or less in wavelength), KrF excimer laser light (248.4 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Another approach used to reduce the problem of reflected radiation has been the use of a radiation absorbing layer interposed between the substrate surface and the photoresist coating layer. See, for example, PCT application WO 90/03598, EPO application No. 0 639 941 A1 and U.S. Pat. Nos. 4,910,122, 4,370,405 and 4,362,809, all incorporated herein by reference for their teaching of antireflective (antihalation) compositions and the use of the same. Such layers have also been referred to in the literature as antireflective layers or ARCs (antireflective compositions).

In Shipley Company's European Applications 542008A1 and 0813114A2 highly useful antihalation (antireflective) compositions are disclosed.

While it has been found that prior ARC compositions may be effective for many antireflective applications, prior compositions also may pose some potential performance limitations, particularly when used at short wavelength imaging applications.

It thus would be desirable to have new antireflective coating compositions. It would be particularly desirable to have new antireflective coating compositions that effectively absorb undesired reflections of short wavelength radiation, including sub-200 nm radiation such as 193 nm.

SUMMARY OF THE INVENTION

The present invention provides new light absorbing compositions suitable for use as an antireflective coating composition ("ARC"), particularly for short wavelength imaging applications, such as 193 nm imaging. The ARCs of the invention in general comprise a resin binder that effectively absorbs short wavelength exposure radiation to reduce reflections of same, and optionally comprise a crosslinker component.

Preferred resin binders of ARCs of the invention contain phenyl units, preferably pendant from a polymer backbone.

Particularly preferred ARC resin binders of the invention do not have any alkyl (e.g. optionally substituted $(-CH_2-)_n$ where n is 1 to about 6 or 8) units interposed between the polymer backbone and a pendant phenyl group. For example, preferred pendant groups include those provided by polymerization of optionally substituted styrene, optionally substituted isopropenyl styrene, optionally substituted phenyl acrylate, and optionally substituted phenyl methacrylate. As referred to herein, references to a phenyl group being "directly pendant" from a polymer backbone indicate that no alkyl or other groups are interposed between the polymer backbone and the phenyl group, such as provided by condensation of optionally substituted styrene or isopropenyl styrene units.

Nevertheless, while less preferred, the invention also includes ARCs having resin binders that have pendant phenyl groups where an alkyl (e.g. optionally substituted (—CH2—)$_n$ where n is 1 to about 6 or 8) linkage is interposed between the backbone and the phenyl group, e.g. as may be provided by polymerization of 2-phenyl-1-ethyl methacrylate and the like.

The antireflective composition resin binder with phenyl chromophore moieties suitably is a copolymer and is prepared by polymerizing two or more different monomers where at least one of the monomers includes a phenyl chromophore group. For example, preferred additional ARC resin units include those provided by polymerization of acrylate monomers, e.g. hydroxy acrylates such as 2-hydroxyethylmethacrylate,2-hydroxyethylacrylate and the like; $C_{1-12}$ acrylates such as methylmethacrylate, methylacrylate, butylmethacrylate, butylacrylate and the like. Acrylate resins that contain phenyl chromophore units are generally preferred for use in ARCs of the invention. For crosslinking ARCs of the invention, preferably the ARC resin has a hydroxy or other reactive moiety for promoting a curing reaction.

The invention further provides methods for forming a relief image and novel articles of manufacture comprising substrates coated with an ARC composition of the invention alone or in combination with a photoresist composition. Other aspects of the invention are disclosed infra.

DETAILED DESCRIPTION OF THE INVENTION

The resin binder component of the antireflective compositions of the invention are preferably used with short wavelength imaging systems and will effectively absorb sub-200 nm reflections, particularly 193 nm reflections.

In particular, preferred ARC resin binders of the invention have pendant phenyl groups For example, preferred resins have phenyl units of the following Formula I:

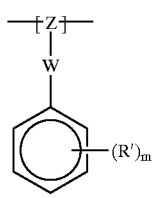

I where W is a chemical bond, an alkyl linkage e.g. optionally substituted (—CH$_2$—)$_n$ where n is from 1 to about 6 or 8), or an ester linkage (i.e. (C=O)O);

each R' hydrogen or a non-hydrogen substituent such as halogen (F, Cl, Br or I); optionally substituted alkyl preferably having 1 to about 8 carbon atoms; optionally substituted alkoxy preferably having 1 to about 8 carbon atoms; optionally substituted ester such as —C(=O)OZ where Z is $C_{1-8}$ optionally substituted alkyl; optionally substituted alkanoyl such as $C_{1-8}$ alkanoyl e.g. acyl and the like; optionally substituted carbocyclic aryl particularly phenyl; optionally substituted aralkyl particularly benzyl(—CH$_2$C$_6$H$_5$); and the like;

m is an integer of from 0 (where the pendent phenyl group is fully hydrogen substituted) to 5; and Z is a bridge group between monomer units of the polymer, e.g. reactive moieties of monomer units such as carbon-carbon double bonds that are polymerized to provide e.g. optionally substituted alkylene, preferably $C_{1-3}$ alkylene optionally substituted by $C_{1-4}$ alkyl.

As discussed above, more preferred are resins that have pendant phenyl groups but without any alkyl (e.g. optionally substituted (—CH$_2$—), where n is from 1 to about 6 or 8) groups interposed between the polymer backbone and the pendant phenyl groups, such as resins that have phenyl units of the following Formula IA:

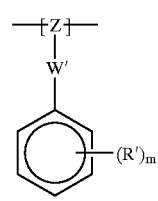

IA where W' is a chemical bond or an ester linkage (i.e. (C=O)O);

each R', m and Z are the same as defined in Formula I above.

As also discussed, particularly preferred resins of ARCs of the invention have acrylate units in addition to repeat units that have phenyl chromophore units. For example, preferred resins include acrylate copolymers that comprise units represented by the following Formula II:

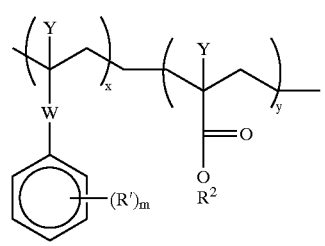

II wherein W, each R' and m are the same as defined above n Formula I;

$R^2$ is optionally substituted alkyl, preferably having 1 to about 20 carbon atoms, more preferably 1 to about 8 to 12 carbon atoms; optionally substituted carbocyclic aryl such as phenyl; or optionally substituted aralkyl such as optionally substituted benzyl, 2-phenylethyl and the like, and preferably $R^2$ is a non-aromatic group;

each Y is independently hydrogen or optionally substituted $C_{1-6}$ alkyl, and preferably each Y is independently hydrogen or methyl; and x and y are mole percents of the respective units in the polymer, and preferably x is from about 5 percent to about 80 or 90 percent, more preferably is from about 10 or 15 percent to about 60 or 70 percent, and still more preferably x is from about 20 to about 50 percent, with the balance of the polymer being comprised of units containing $R^2$ groups, or other units.

Terpolymers and other higher copolymers are especially preferred, such as acrylate copolymers that comprise units represented by the following Formula III:

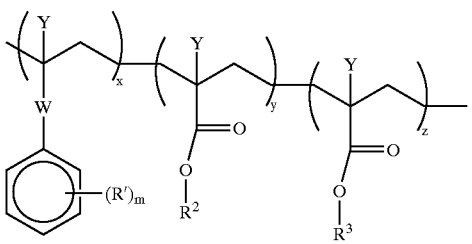

III wherein W, each R' and m are the same as defined above n Formula I;

wherein $R^2$ and $R^3$ are each different and are independently selected from the same group as defined above for $R^2$ in Formula II, each Y is independently hydrogen or optionally substituted $C_{1-6}$ alkyl, and preferably each Y is independently hydrogen or methyl; and x, y and z are mole percents of the respective units in the polymer, and preferably x is from about 5 percent to about 80 or 90 percent, more preferably is from about 10 or 15 percent to about 60 or 70 percent, and still more preferably x is from about 20 to about 50 percent, with the balance of the polymer being comprised of units containing $R^2$ and $R^3$ groups, or other units.

Preferred $R^2$ and $R^3$ of the above formulae include hydroxy-substituted alkyl groups, particularly $C_{1-6}$ hydroxyalkyl such as 2-hydroxyethyl and hydroxypropyl; alicyclic $C_{1-8}$ alkyl such as provided by condensation of methyl methacrylate, methyl acrylate, ethyl methacrylate, ethyl acrylate, hexyl methacrylate, hexyl acrylate; and cyclic alkyl groups suitably having from 3 to about 20 carbons such as cyclohexyl, adamantyl, isobornyl and the like that may be provided by condensation of the corresponding acrylates and methacrylates.

As indicated above, ARC resins also may have other units such as pendant cyano and itaconic anhydride groups. Preferably, the itaconic anhydride moiety will be directly pendant to the polymer backbone, i.e. the moiety is directly pendant to a polymer bridge group without any alkylene, aryl or other group interposed between the polymer bridge group and the itaconic anhydride group. While the cyano group is preferably directly pendant to the polymer backbone (via condensation of acrylonitrile or the like), a linker group also may be interposed between the cyano group and a polymer bridge group.

As discussed herein, various moieties of an ARC resin or other ARC or resist components may be optionally substituted. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{2-8}$ alkenyl; $C_{2-8}$ alkynyl; hydroxyl; alkanoyl such as a $C_{1-6}$ alkanoyl e.g. acyl and the like; etc.

Particularly preferred polymers for use in ARCs of the invention include terpolymers of Formula III above where the mole percent on phenyl units (i.e. the value x in Formula III) is from 10 to about 60 percent, more preferably from about 10 or 15 percent to about 40 or 50 percent; $R^2$ is optionally substituted alkyl particularly $C_{1-6}$ hydroxyalkyl such as 2-hydroxyethyl, and the mole percent of ester units having $R^2$ groups (i.e. the value y in Formula III) is from about 1 to 50 or 60 mole percent, more preferably about 10 to 40 or 50 mole percent; and $R^3$ is unsubstituted alkyl such as $C_{1-8}$ alicyclic alkyl, e.g. methyl, ethyl, etc., or a cyclic alkyl group and, and the mole percent of ester units having $R^3$ groups (i.e. the value z in Formula III) is from about 10 to 60 or 70 mole percent, more preferably about 20 or 30 percent to 40 or 50 mole percent; and each Y is independently hydrogen or methyl. See the examples which follow for specifically preferred ARC resins.

ARC resin binders of the invention are preferably synthesized by polymerizing monomers that are the same, or preferably where the monomers differ to provide a copolymer. At least one type of polymerized monomer contains a phenyl group. A free radical polymerization is suitably employed, e.g., by reaction of monomers to provide the various units in the presence of a radical initiator preferably under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See the examples which follow for exemplary reaction conditions. Suitable reaction temperatures for any particular system can be readily determined empirically by those skilled in the art based on the present disclosure. A reaction solvent may be employed if desired. Suitable solvents include alcohols such as tetrahydrofiran, propanols and butanols and aromatic solvents such as benzene, chlorobenzene, toluene and xylene. Dimethylsulfoxide and dimethylformamide also can be suitable. The polymerization reaction also may be run neat. A variety of free radical initiators may be employed to prepare the copolymers of the invention. For example, azo compounds may be employed such as Vazo 52 (DuPont), azo-bis-2,2'-isobutyronitrile (AIBN) and 1,1'-azobis (cyclohexanecarbonitrile). Peroxides, peresters, peracids and persulfates also can be employed.

Preferably the ARC resin binder will have a weight average molecular weight (Mw) of about 1,000 to about 10,000,000 daltons, more typically about 5,000 to about 1,000,000 daltons, and a molecular number molecular weight (Mn) of about 500 to about 1,000,000 daltons. Molecular weights (either Mw or Mn) of the polymers of the invention are suitably determined by gel permeation chromatography.

Resin binders of the invention preferably exhibit good absorbance at short wavelengths such as below 200 nm, particularly 193 nm. More specifically, preferred resin binders of the invention have optical densities of at least about 3 absorbance units per micron (Absorb. units/$\mu$) at about 193 nm, preferably from about 5 to 20 or more absorbance units per micron at 193 nm, more preferably from about 8 to 16 or more absorbance units per micron at 193 nm. Higher absorbance values for a particular resin can be obtained by increasing the percentage of chromophore units on the resin.

The antireflective compositions of the invention also may contain resins that do not include phenyl chromophore units as a co-resin present with resins having phenyl chromophore units.

The concentration of the resin binder component of the antireflective compositions of the invention may vary within relatively broad ranges, and in general the resin binder is employed in a concentration of from about 50 to 95 weight percent of the total of the dry components of the ARC, more typically from about 60 to 90 weight percent of the total dry components (all components except solvent carrier).

Crosslinking-type ARCs of the invention also contain a crosslinker component or material. A variety of crosslinkers may be employed, including those ARC crosslinkers disclosed in the above-mentioned Shipley European Application 542008.

Low basicity crosslinkers are particularly preferred such as a methoxy methylated glycouril. A specifically preferred crosslinker is a methoxy methylated glycouril corresponding to the following structure IV:

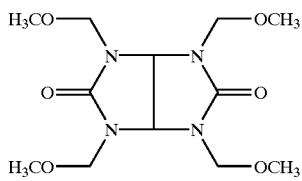

This methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$hydroxyalkyl substituents. Phenol compounds are generally preferred such as di-methanolphenol ($C_6H_3(CH_2OH)_2OH$) and other compounds having adjacent (within 1-2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

Crosslinking antireflective compositions of the invention preferably further comprise an acid or acid generator compound for catalyzing or promoting reaction of the glycouril compound during curing of an ARC coating layer. Preferably an acid generator compound is employed that liberates acid upon photolysis or thermal treatment. Preferably the acid generator is a thermal acid generator is employed, i.e. a compound that generates acid upon thermal treatment. A variety of known thermal acid generators are suitably employed such as e.g. 2,4,4,6-tetrabromocyclohexadienone, benzoin tosylate, nitrobenzyl tosylate particularly 4-nitrobenzyl tosylate, and other alkyl esters of organic sulfonic acids. Compounds that generate a sulfonic acid upon activation are generally suitable. Typically a thermal acid generator is present in an antireflective composition in concentration of from about 0.5 to 15 percent by weight of the total of the dry components of the composition, more preferably about 2 percent by weight of the total dry components. Instead of or in addition to a thermal acid generator, a photoacid generator may be employed as an acid generator, and the ARC coating layer blanket exposed to activating radiation prior to application of an overcoated photoresist composition.

Also, rather than an acid generator, an acid may be simply formulated into a crosslinking ARC of the invention, particularly for ARCs that require heating to cure in the presence of acid so that the acid does not promote undesired reaction of composition components prior to use of the ARC. Suitable acids include e.g. strong acids such as sulfonic acids such as toluene sulfonic acid and sulfonic acid, triflic acid, or mixtures of those materials.

The present invention also includes antireflective compositions that do not undergo significant cross-linking during intended use with a photoresist composition. Such non-crosslinking antireflective compositions need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or acid source for promoting a crosslinking reaction.

Antireflective compositions of the invention preferably also comprise one or more photoacid generators (i.e. "PAG") that are suitably employed in an amount sufficient to inhibit or substantially prevent undesired notching or footing of an overcoated photoresist layer. In this aspect of the invention, the photo acid generator is not used as an acid source for promoting a crosslinking reaction, and thus preferably the photoacid generator is not substantially activated during crosslinking of the antireflective composition (in the case of a crosslinking ARC). In particular, with respect to antireflective compositions that are thermally crosslinked, the antireflective composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

Generally preferred photoacid generators for such use in ARCs of the invention include e.g. onium salts such as di(4-tert-butylphenyl)iodonium perfluoroctane sulphonate, halogenated non-ionic photoacid generators such as 1,1-bis [p-chlorophenyl]-2,2,2-trichloroethane, and other photoacid generators disclosed herein for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$ alkyl or $C_{2-15}$alkenyl having one or preferably two or more fluoro substituents.

Particularly preferred antireflective composition photo-acid generators of the invention can be activated upon exposure to sub-200 nm radiation, particularly about 193 nm, so that the antireflective composition can be effectively used with overcoated photoresists that are imaged at 193 nm. Suitably the photoacid generator of the antireflective composition and the photoacid generator of the photoresist composition will be activated at the same exposure wavelength. Sensitizer materials formulated into the photoresist composition and/or antireflective compositions also can be used to ensure that a single exposure wavelength will activate the photoacid generators of both the antireflective and photoresist compositions.

It is further preferred that an antireflective composition of the invention is used together with a photoresist composition where the antireflective composition photoactive compound and photoresist photoactive compound generate the same or approximately the same acid compound (photoproduct) upon exposure to activating radiation during irradiation of the photoresist layer, i.e. photoproducts that preferably have similar diffusion characteristics and similar acid strengths. It has been found that resolution of an overcoated resist relief image is even further enhanced with such matching of the respective antireflective composition and resist photoacid products. References herein to "substantially the same" antireflective composition and resist photoacid products means that those two photoproducts differ no more than no about 2 or 2.5 in $pK_a$ values (measured at 25° C.), preferably the two photoproducts differ no more than about 1 or 1.5 in pK$_a$ values, and still further preferably the two photoproducts differ no more than about 0.75 in pK$_a$ values. It is further preferred that such "substantially the same" antireflective composition and resist photoacid products differ in molecular weight by no more than about 40 percent, preferably by no more than about 20 percent, still more preferably by no more than about 15 percent. It is still further preferred that the antireflective composition and resist photoproducts are each of the same class of acids, e.g. that both photo products are sulfonate acids or both are halo-acids such as HBr and the like. Suitable amounts of the PAG can vary rather widely and can be readily determined empirically. In general, the one or more PAGs of an antireflective composition of the invention may be suitably employed in amounts of about 0.25 to 5 weight percent or less based on total weight of the antireflective composition. See the examples which follow for exemplary amounts. Particularly preferred amounts of a PAG of an antireflective composition also may vary depending on the characteristics and processing conditions of the photoresist that is used with the antireflective composition. For instance, if the photoresist photoacid generator produces a relatively strong acid photoproduct whereby the photoresist is post-exposure baked (PEB) at relatively low temperatures, then the photoacid product of the antireflective composition will be less likely to thermally decompose at such low PEB temperatures, resulting in a relatively higher effective concentration of acid in the antireflective composition. Accordingly, that antireflective composition can be effectively formulated with a relatively lower concentration of photoacid generator. Conversely, if a photoresist is used that is post-exposure baked at relatively high temperatures, then a portion of the photoacid product of the antireflective composition may be more likely to be thermally decomposed. In such case, the antireflective composition may be formulated with a relatively higher concentration of photoacid generator to ensure an effective concentration of photogenerated acid and maximum reductions of undesired footing.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 430 available from the 3M Company. Such of such surfactants/surface leveling agents is preferred. Preferred surfactant is concentration between 0.5 to 1.5% of solids, more preferably between about 0.7–1.0 % of solids. See Examples 51–55 which follow.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gammabutyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Preferably, ARCs of the invention are used with chemically amplified positive-acting resist compositions. Photoresists for use with ARCs of the invention in general contain a resin binder and a photoactive component.

Preferred photoresists for use with the ARCs of the invention are designed for imaging at sub-nm200 nm wavelengths particularly 193 nm. Preferred resist compositions for use with ARCs of the invention have been disclosed in copending and commonly assigned application Ser. No. 09/143,462, filed on Aug. 28, 1998, In particular, preferred resist resin binders for use with the ARCs of the invention have pendant photoacid-labile ester repeat units that contain a non-cyclic or single ring alkyl group having 5 or more carbons and two or more secondary or tertiary carbon radicals, such as pendant esters of the following structures 1 through 17, and wherein the depicted substituent Y is preferably hydrogen or methyl, more preferably methyl.

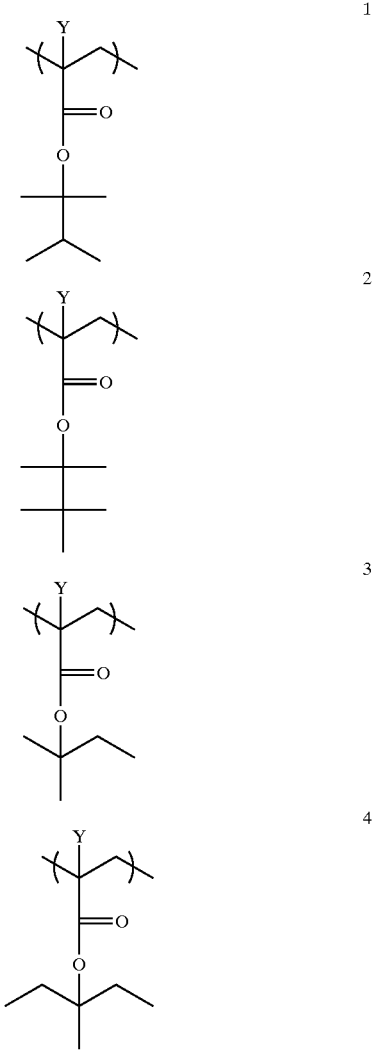

-continued
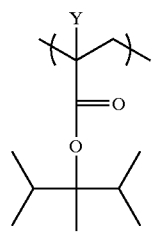
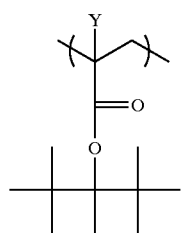
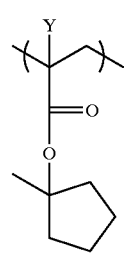
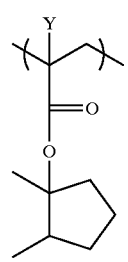
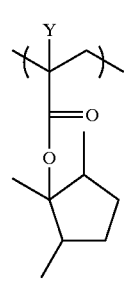
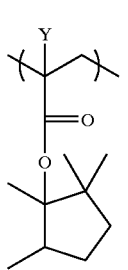
-continued
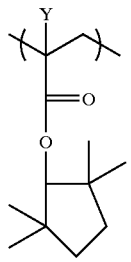
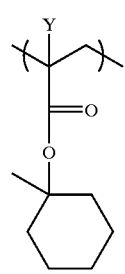
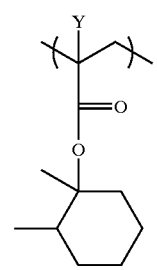
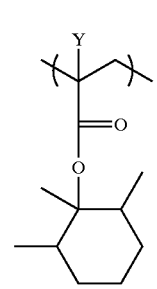
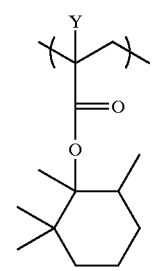
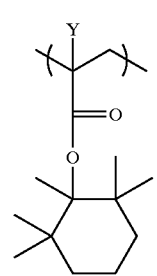

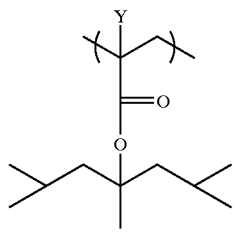

17

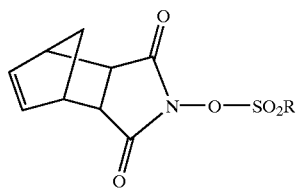

Polymers for as a resist resin binder component also may have other units such as pendant cyano and itaconic anhydride groups. Preferably, the itaconic anhydride moiety will be directly pendant to the polymer backbone, i.e. the moiety is directly pendant to a polymer bridge group without any alkylene, aryl or other group interposed between the polymer bridge group and the itaconic anhydride group. While the cyano group is preferably directly pendant to the polymer backbone, a linker group also may be interposed between the cyano group and a polymer bridge group.

Polymers used as resin binders of resists of the invention optionally may contain still further units such as groups that contribute to aqueous developability of a photoresist. For example, preferred polymer groups that contribute to aqueous developability contain carboxy or hydroxy moieties such as may be provided by condensation of acrylic acid, methacrylic acid, 2-hydroxyethylmethacrylate, or other monomers. Other optional polymer units include those that may be provided by condensation of a vinyl alicyclic group, e.g. 2-adamantyl-2-methyl methacrylate, isobornyl methacrylate and the like, or a non-cyclic alkyl group such as t-butylmethacrylate and the like. Generally preferred acid labile polymers for use in chemically-amplified photoresists of the invention have one or more polymerized units of monomers of isobornyl methacrylate, methacrylonitrile, itaconic anhydride, methacrylic acid, tert-butyl methacrylate, 2-methyl-2adamntyl methacrylate or 2,3-dimethyl-2-butyl-methacrylate.

Suitable photoacid generator compounds of resists used with ARCs of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Preferred PAGs for photoresists used with ARCs of the invention include imidosulfonates such as compounds of the following formula:

wherein R is camphor, adamantane, alkyl (e.g. $C_{1-12}$alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

The following PAGs 1 and 2 are also preferred for resists used with ARCs of the invention:

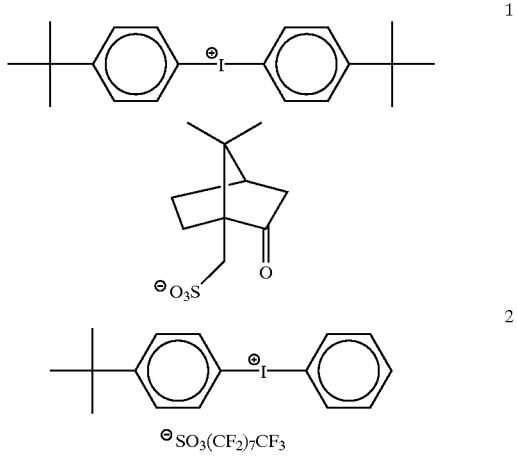

Such sulfonate compounds can be prepared as disclosed in European Patent Application 96118111.2 (publication number 0783136), which details the synthesis of above PAG 1. Briefly, PAG I can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then camphorsulfonic acid is added followed by neutralization with ammonium hydroxide.

Also suitable are the above two iodonium compounds complexed with anions other than the above-depicted camphorsulfonate and perfluorooctanesulfonate groups. In particular, preferred anions include those of the formula $RSO_3$ where R is adamantane, alkyl (e.g. $C_{1-12}$alkyl) and other perfluoroalkyl such as perfluoro ($C_{1-12}$ alkyl), particularly perfluorobutanesulfonate and the like.

Other known PAGS also may be employed in resists used in accordance with the invention. For 193 nm imaging, generally preferred are PAGS that do not contain aromatic groups, such as the above-mentioned imidosulfonates, in order to provide enhanced resist transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

ARCs of the invention that include a low basicity crosslinker such as a suitable glycouril are particularly useful with photoresists that generate a strong acid photoproduct upon exposure such as triflic acid, camphor sulfonate or other sulfonic acid, or other acid having a pKa (25° C.) of about 2 or less. Without wishing to be bound by theory, it is believed ARCs of the invention are particularly effective with such strong acid resists because the strong photogenerated acid will migrate from the resist and remain in the ARC layer to a lesser extent relative to a comparable ARC that contain a more basic crosslinker. That is, the low basicity crosslinkers of the invention will tie up strong photogenerated acids of an overcoated resist layer to a lesser extent than a more basic ARC crosslinker. As a result thereof, less acid loss from the resist layer will occur and resolution problems such as potential footing will be reduced or avoided.

In use, an antireflective composition of the invention is applied as a coating layer to a substrate may any of a variety of methods such as spin coating. The antireflective composition in general is applied on a substrate with a dried layer thickness of between about 0.02 and 0.5 µm, preferably a dried layer thickness of between about 0.04 and 0.20 µm. The substrate is suitably any substrate conventionally used in processes involving photoresists. For example, the substrate can be silicon, silicon dioxide or aluminum-aluminum oxide microelectronic wafers. Gallium arsenide, ceramic. quartz or copper substrates may also be employed. Substrates used for liquid crystal display or other flat panel display applications are also suitably employed, for example glass substrates, indium tin oxide coated substrates and the like.

Preferably the antireflective layer is cured before a photoresist composition is applied over the ARC. Cure conditions will vary with the components of the ARC. Thus, if the composition does not contain an acid or acid generator, cure temperatures and conditions will be more vigorous than those of a composition containing an acid or acid generator compound. Typical cure conditions are from about 120° C. to 225° C. for about 0.5 to 40 minutes. Cure conditions preferably render the ARC coating layer substantially insoluble to the photoresist solvent as well as an alkaline aqueous developer solution.

After such curing a photoresist is applied over the surface of the ARC. As with application of the ARC, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the ARC layer and photoresist layer should occur.

The resist layer is then imaged with activating radiation through a mask in conventional manner. The exposure energy is sufficient to effectively activate the photoactive component of the resist system to produce a patterned image in the resist coating layer, more specifically, the exposure energy typically ranges from about 3 to 300 mJ/cm$^2$ depending upon the exposure tool. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an organic alkali exemplified by tetrabutyl ammonium hydroxide, or an inorganic alkali such as sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antihalation coating layer.

All documents mentioned herein are incorporated herein by reference. The following non-limiting examples are illustrative of the invention.

EXAMPLES 1–3

Synthesis of Polymers

EXAMPLE 1

A terpolymer consisting of styrene, 2-hydroxethylmethacrylate and methylmethacrylate monomers with a mole ratio of 30:38:32 was synthesized according to the following procedure:

The monomers (styrene, 99% pure from Aldrich, 169.79 g; 2-hydoxyethylmethacrylate obtained from Rohm and Haas Corporation "Rocryl 400", 269.10 g; and methylmethacrylate obtained from Rohm & Haas Corporation, 173.97 g), were dissolved in 2375 g of THF in a 5L 3-neck round bottom fitted with overhead stirring, a condenser, and a nitrogen inlet. The reaction solution was degassed with a stream of nitrogen for 20 min. The Vazo 52 initiator (11.63 g, from DuPont Corporation) was added and the solution was heated to reflux (65–67° C.). This temperature was maintained for 15 hours. The reaction solution was cooled to room temperature and precipitated into 12L of MTBE/cyclohexane (v/v 1/1). The polymer was collected by vacuum filtration and vacuum dried at 50° C. for 48 hours. Yield=68%, and subsequent analysis found the residual monomers=2.4 wt %, Tg=92° C., Td=239° C. The mole concentration of the Vazo 52 initiator relative to the sum of the mole concentration of monomers was 0.72%. Molecular weight analysis by gel permeation chromatography relative to polystyrene standards gave a Mw=22416, Mn=10031.

EXAMPLES 2–3

Additional terpolymers of styrene:2-hydroxymethacrylate:methylmethacrylate were synthesized similar to the procedure of Example 1, except that the mole % of the initial monomer amounts were varied according to the following:

EXAMPLE 2

Polymer with mole % ratio of 12:38:50. Tert-butyl methyl ether (5000 mL) was used as the precipitation solvent. Yield was 168 g (84% of theory). Molecular weight analysis by gel permeation chromatography relative to polystyrene standards gave a Mw=19612, Mn=10434, and subsequent analysis found $T_g$=76° C., and $T_d$=201° C.

EXAMPLE 3

A terpolymer consisting of styrene, 2-hydroxethylmethacrylate and methylmethacrylate monomers with a mole ratio with mole % ratio of 18:38:44. Hexanes (4500 mL)) was used as the precipitation solvent. Yield was 68 g (79% of theory).). Molecular weight analysis by gel permeation chromatography relative to polystyrene standards gave a Mw=22,712, Mn=11,564, and subsequent analysis found $T_g$=107° C.

EXAMPLE 4

A terpolymer of styrene:2-hydroxymethacrylate: methylmethacrylate with the monomers in a mole % ratio of 30:38:32 was synthesized according to the procedure of Example 1; with the mole % of the initiator (Vazo 52) at 0.36%. Molecular weight analysis by gel permeation chromatography relative to polystyrene standards gave a Mw=54502, Mn=22495.

EXAMPLE 5

A tetrapolymer of styrene:2-hydroxymethacrylate: methylmethacrylate:n-butyl methacrylate in a mole % ratio of 30:38:31:1 was synthesized according to the procedure of Example 1; with the mole % of the initiator (Vazo 52) at 0.72%. Molecular weight analysis by gel permeation chromatography relative to polystyrene standards gave a Mw=22646, Mn=10307 and subsequent analysis found $T_g$=74° C., $T_d$=331° C.

EXAMPLE 6

A terpolymer of 4-acetoxystyrene: 2-hydroxymethacrylate: methylmethacrylate was synthesized according to the procedure of Example 1 in a mole % ratio of 18:38:44 Example 1; with the mole % of the initiator (Vazo 52) at 0.36%. Polymer yield was 84%. Molecular weight analysis by gel permeation chromatography relative to polystyrene standards gave a Mw=73888, Mn=29973. Subsequent analysis found $T_g$=74° C., $T_d$=247° C.

EXAMPLE 7

A terpolymer of phenyl methacrylate: 2-hydroxymethacrylate: methylmethacrylate was synthesized according to the procedure of Example 1 in a mole % ratio of 30:38:32. Example 1; with the mole % of the initiator (Vazo 52) at 0.36%. Yield was 94%.Molecular weight analysis by gel permeation chromatography relative to polystyrene standards gave a Mw=111039, Mn=26866. Subsequent analysis found $T_g$=91° C., $T_d$=242° C.

EXAMPLE 8

A terpolymer of benzyl methacrylate: 2-hydroxymethacrylate: methylmethacrylate was synthesized according to the procedure of Example 1 in a mole % ratio of 18:38:44 Example 1; with the mole % of the initiator (Vazo 52) at 0.91%. Polymer yield was 99%. Molecular weight analysis by gel permeation chromatography relative to polystyrene standards gave a Mw=21614, Mn=11379.

EXAMPLE 9

A terpolymer of 2-phenyl-1-ethyl methacrylate: 2-hydroxymethacrylate: methylmethacrylate was synthesized according to the procedure of Example 1 in a mole % ratio of 18:38:44 Example 1; with the mole% of the initiator (Vazo 52) at 0.91%. Polymer yield was 98%. Molecular weight analysis by gel permeation chromatography relative to polystyrene standards gave a Mw=29008, Mn=15956.

EXAMPLE 10

An anti-reflective coating (ARC) composition was prepared using the polymer of Example 1 according to the following procedure: Into a 100 mL bottle was weighed 1.2175 g of the polymer of Example 1, 0.225 g of tetramethoxymethyl glycoluril (American Cyanamid), 0.0075 g of p-tolyl sulphonic acid, 0.0135 g of FC-430 (3M Company), 0.0965 g of di(4-tert-butylphenyl)iodonium perfluorooctane sulphonate (Daychem Corp.) and 48.44 g of propylene glycol monomethyl ether alcohol ("Dowanol PM", Dow Corporation), which was placed onto a roller to facilitate dissolution. After dissolution, the ARC composition was filtered through either a 0.1 $\mu$m or 0.2 $\mu$m Teflon filter into a clean bottle.

EXAMPLE 11

An anti-reflective coating (ARC) composition was prepared using the polymer of Example 1 according to the following procedure: Into a 100 mL bottle was weighed 1.2175 g of the polymer of Example 1,0.150 g of tetramethoxymethyl glycoluril (American Cyanamid), 0.075 g of hexamethoxymelamine mixture ("Cymel 303"), 0.0075 g of p-tolyl sulphonic acid, 0.0135 g of FC-430 (3M Company), 0.0965 g of di(4-tert-butylphenyl)iodonium perflourooctane sulphonate (Daychem Corp.) and 48.44 g of propylene glycol monomethyl ether alcohol ("Dowanol PM", Dow Corporation), which was placed onto a roller to facilitate dissolution. After dissolution, the ARC composition was filtered through either a 0.1 $\mu$m or 0.2 $\mu$m Teflon filter into a clean bottle.

EXAMPLE 12

An anti-reflective coating (ARC) composition was prepared using the polymer of Example 1 according to the following procedure: Into a 500 mL bottle was weighed 4.571 g of the polymer of Example 1, 0.8438 g of tetramethoxymethyl glycoluril (American Cyanamid), 0.0281 g of p-nitrobenzyltoslyate, 0.0450 g of FC-430 (3M Company), 0.1371 g of di(4-tert-butylphenyl)iodonium perflourooctane sulphonate (Daychem Corp.) and 48.44 g of propylene glycol monomethyl ether alcohol ("Dowanol PM", Dow Corporation), which was placed onto a roller to facilitate dissolution. After dissolution, the ARC composition was filtered through either a 0.1 $\mu$m or 0.2 $\mu$m Teflon filter into a clean bottle.

EXAMPLE 13

An anti-reflective coating (ARC) composition was prepared using the polymer of Example 1 according to the following procedure: Into a 100 mL bottle was weighed 1.314 g of the polymer of Example 1, 0.225 g of tetramethoxymethyl glycoluril (American Cyanamid), 0.0075 g of p-tolyl sulphonic acid, 0.0135 g of FC-430 (3M Company) and 48.44 g of propylene glycol monomethyl ether alcohol ("Dowanol PM", Dow Corporation), which was placed onto a roller to facilitate dissolution. After dissolution, the ARC composition was filtered through either a 0.1 µm or 0.2 µm Teflon filter into a clean bottle.

EXAMPLES 14–18

Anti-reflective compositions were prepared using a procedure and composition very similar to Example 13, with the exception that the amounts of the p-tolyl sulphonic acid and tetramethoxymethyl glycoluril were varied. Table 1 lists the percentages by weight of the total amount of solids in the composition of these two components:

TABLE 1

ARC compositions

| Example | wt % of solids of tetramethoxymethyl glycoluril | wt % of solids of p-tolyl sulphonic acid |
|---|---|---|
| 14 | 12 | 0.1 |
| 15 | 18 | 0.1 |
| 16 | 15 | 0.3 |
| 17 | 12 | 0.5 |
| 18 | 18 | 0.5 |

EXAMPLES 19–23

Anti-reflective compositions were prepared using a procedure and composition very similar to Example 13, with the exception that the amounts of FC430 was varied. Table 2 lists the percentages by weight of the total amount of solids in the composition of these this component:

TABLE 2

ARC compositions

| Example | wt % of solids of FC430 |
|---|---|
| 19 | 0.2 |
| 20 | 0.5 |
| 21 | 0.8 |
| 22 | 1.1 |
| 23 | 2.0 |

EXAMPLES 24–25

Anti-reflective compositions were prepared using a procedure and composition very similar to Example 13, with the following weights of components in the composition: 0.6102 g of the polymer, 0.1125 g of tetramethoxymethyl glycoluril (American Cyanamid), 0.0030 g of p-tolyl sulphonic acid, 0.0060 g of FC-430 (3M Company), 0.0183 g of di(4-tert-butylphenyl)iodonium perflourooctane sulphonate (Daychem Corp.) and 24.25 g of propylene glycol monomethyl ether alcohol ("Dowanol PM", Dow Corporation). These compositions are described in Table 3:

TABLE 3

ARC compositions

| Example | Polymer of Example |
|---|---|
| 24 | 8 |
| 25 | 9 |

EXAMPLES 26–32

Anti-reflective compositions were prepared using a procedure and composition very similar to Example 13, with the following weights of components in the composition: 0.974 g of the polymer, 0.180 g of tetramethoxymethyl glycoluril (American Cyanamid), 0.0060 g of p-tolyl sulphonic acid, 0.0108 g of FC-430 (3M Company), 0.0292 g of di(4-tert-butylphenyl)iodonium perflourooctane sulphonate (Daychem Corp.) and 38.80 g of propylene glycol monomethyl ether alcohol ("Dowanol PM", Dow Corporation).). These compositions are described in Table 4:

TABLE 4

ARC compositions

| Example | Polymer of Example |
|---|---|
| 26 | 1 |
| 27 | 4 |
| 28 | 6 |
| 29 | 7 |
| 30 | 2 |
| 31 | 3 |
| 32 | 5 |

EXAMPLES 33–35

Optical Testing of ARC Compositions ARC compositions were spin-coated on 200 mm Si wafers and baked at 215° C./90 s on a 150 µm proximity hotplate using a modem FSI wafer coating track. The ARC films were then measured using a Wollem ellipsometer (Lincoln, Nebr.) to determine their optical indices of refraction n and k (real and imaginary) at 193 nm. The imaginary index of refraction is related to film absorbance; values of about k=0.3 or greater are necessary to minimize film stack reflectivity while minimizing ARC film thickness. Most desirable are values of about k=0.4 or greater. These values are tabulated in Table 5:

TABLE 5

ARC optical parameters measured at 193 nm

| Example | real refractive index, n | imaginary refractive index, k |
|---|---|---|
| Shipley AR2 (Shipley Corp.) | 1.70 | 0.10 |
| 33 | 1.73 | 0.216 |
| 34 | 1.74 | 0.295 |
| 35 | 1.77 | 0.40 |

These data illustrate that the comparative material, namely a widely-used commercial ARC material designed for use at 248 nm, Shipley AR2, has an imaginary refractive index significantly lower than what is desired to minimize reflectivity at 193 nm. These data also show that the k-value of compositions 30–32 increase with increasing phenyl moiety in the polymer (in this case introduced through the styrene monomer). It is the belief of the authors that the phenyl group is a good chromophore at 193 nm, and selecting the ideal phenyl group concentration in the polymer one can achieve a desirable imaginary refractive index, k.

EXAMPLES 36–40

Evaluation of ARC insolubility after baking It is strongly desirable that the ARC film is hardened during the coating and baking process such that it becomes impervious to the subsequent coating of photoresist in latter lithographic processing steps. In this invention, ARC hardening during the bake is achieved through chemical acid-catalyzed cross-linking of the polymer. Modem defect-free lithographic processing, particularly for use in semiconductor manufacturing requires that the interface between the resist pattern and the ARC substrate to be as free as possible of scumming, residues and flaring while maintaining an excellent edge acuity. Resist patterns must also adhere well to the ARC during lithographic process steps. In order to meet these requirements, it is the belief of the inventors that intermixing of the resist with the hardened ARC film should be minimized to whatever extent possible.

Several ARC hardened films were studied to determine if they were impervious to dissolution or swelling in a typical commercially-used resist coating solvent, ethyl lactate. Accordingly, the ARC composition was coated on Si, baked at 215° C./60 s to yield a 60 nm thick film. The film thickness was then measured at 11 points using a Nanometrics 215 AFT film thickness measuring tool. Then the ARC-coated wafer was immersed in a beaker of ethyl lactate solvent for 60 s. The ethyl lactate was rinsed off with water, and the wafer was air-dried. Film thickness was remeasured at the same positions using the same measuring tool. The change in thickness was recorded. Results are shown in Table 6:

TABLE 6

Variation in ARC film thickness following a 60 s immersion in ethyl lactate solvent

| Example | Resist Composition | Change in Thickness (Å) after immersion | Comments |
|---|---|---|---|
| 36 | 14 | 44 Å loss | discolored film |
| 37 | 15 | 34 Å loss | discolored film |
| 38 | 16 | 0 Å | good quality |
| 39 | 17 | 0 Å | good quality |
| 40 | 18 | 0 Å | good quality |

Examples 38–40 show that compositions 16, 17 and 18 were impervious to either dissolution or swelling in ethyl lactate solvent. This positive result is an indication that these compositions will form subsequent clean interfaces between the resist pattern and the ARC film during standard lithographic patterning. Examples 36–37 show some dissolution of ARC in the resist solvent, indicating that the lithographic processing will likely not be as successful as Examples 38–40. Compositions 16–18 had higher toluene sulphonic acid concentrations in the initial ARC composition (0.3%–0.5%) as compared to Examples 14 and 15 which had lower acid concentrations (0.1%). As a result, preferred acid concentration in the ARC composition is greater than 0.1%, and more preferably 0.3% or higher. While not being bound by theory, it is believed that the higher acid concentration leads to a higher crosslinking density in the ARC film during baking, making it more impervious to solvent attack. A toluene sulphonic acid concentration of at least 0.3% was therefore used in further ARC material and composition evaluations.

EXAMPLES 41–42

Resist compositions used in evaluating ARC efficacy Photoresist compositions suitable for lithographic testing was prepared by dissolving a combination of 0.524 g of perfluoro-octanesulphonate-norbonene dicarboximide, 0.0449 g of di(4-tert-butylphenyl)iodonium perfluorooctanesulphonate (DTBIPFOS) and a binder polymer into a stock solution containing 0.0045 g of 1,8-diazabicyclo [5.4.0]undec-7-ene (Aldrich Corp, USA), 0.0075 g of Silwet 7604 (Dow Corning Co., USA) and 43.5 g of propyleneglycol methyl ether acetate (Dow Corp., USA). To aid in dissolving DTBIPFOS, this material was added to the resist composition as 5% solutions in ethyl lactate. After dissolution, the resist composition was filtered through either a 0.1 μm or 0.2 μm Teflon filter into a clean bottle.

EXAMPLE 41

A binder polymer with a molar feed ratio of 31:22:10:14:23 of isobornyl methacrylate:tert-butyl methacrylate:methacrylic acid: methacrylonitrile: itaconic anhydride was used in the described resist composition. This polymer was prepared through the following procedure:

Into a 500 mL flask was placed 12.54 g of itaconic anhydride, 15.20 g of tert-butyl methacrylate, 4.58 g of methacrylonitrile, 4.28 g of methacrylic acid, 33.57 g of isobornyl methacrylate, and 100 mL of anhydrous tetrahydrofuran. All reagents were at least 99% pure. The flask was fitted with a magnetic stirring bar, a condenser and an addition funnel. All ingredients were sparged with $N_2$ gas for 20 minutes prior to reaction. In the condenser was placed 0.75 g of Vazo52 free-radical initiator and 25 mL of anhydrous tetrahydrofuran. The solution was brought to 70° C., and then the initiator was added over a 20 minute period. The flask was maintained at 70° C. for 14 hours, and then cooled to room temperature. Polymer was obtained by precipitation into 3 L of hexane, and dried in a Buchner funnel. Then the polymer was re-dissolved into 120 mL of acetone and reprecipitated into 3 L of hexane, and collected on a Buchner funnel. The polymer was dried overnight in a vacuum oven at room temperature. Yield was 49.96 g (66%).

EXAMPLE 42

A binder polymer with a molar feed ratio of 15:10:28:10:14:23 of isobornyl methacrylate:2,3-dimethyl-2-butylmethacrylate: methacrylate:methacrylic acid: methacrylonitrile: itaconic was used in the described resist composition. This polymer was prepared through a similar procedure as Example 41.

The 2,3-dimethyl-2-butylmethacrylate was synthesized through the following procedure:

Into a 500 mL flask containing a stir bar, and fitted with a condenser, is placed 180 g of anhydrous tetrahydrofuran, 40 g of 2,3-dimethyl-1 -butanol and 40.93 g of triethylamine under a $N_2$ atmosphere. To this was dropwise added 40.927 g of purified methacroyl chloride from an addition funnel. The reaction was allowed to warm moderately. After 24 hrs of stirring, the tetrahydrofuran was roto-evaporated from the solution and 100 mL of ethyl acetate was added. The salts were then filtered off though a Buchner funnel. The ethyl acetate was then stripped by use of a rotory-evaporator. A vacuum distillation column was set up with a 8 inch Vigreaux column, stir bar and a few small boiling chips. A fractional distillation was performed and 19.8 g of the product was recovered in the fraction which had a boiling point of approximately 80–87° C. at 6–7 torr of pressure. $^1$H NMR was used to confirm structure and purity.

EXAMPLES 43–64

Lithographic patterning of resist on ARC compositions. In order to assess resolution capability, high-voltage cross-sectional scanning electron microscopic methods were used to examine the printed features. Minimal resolution in an imaged 1:1 pitch grating by choosing an exposure dose such that the patterned 1:1 160 nm lines and 160 nm spaces on the mask actually measured essentially 160 nm in size respectively, and then determining the smallest, essentially full-thickness line which cleanly developed, had a flat top and did not leave residue on the substrate. Photospeed is the exposure dose required in forming such a pattern. We found that the photospeed did not vary significantly with the different ARC compositions; The resist composition of Example 41 gave a photospeed of about 29 mJ/cm$^2$, and the resist composition of Example 42 gave a photospeed of about 24 mJ/cm$^2$.

The lithographic processing was performed on modern wafer-processing tools (manufactured by FSI and SVG Companies) using both 150 mm and 200 mm silicon wafers. All processing was done in an essentially base-contaminant free atmosphere (<5 ppb measure amines/ammonia) The wafers were coated with the ARC composition prior to subsequent processing. ARC films were spin-coated and baked at 215 ° C., with a suitable spin speed chose to yield a thickness of about 65 nm. The photoresist was spun onto the wafers at about 3000 rpm and baked (PAB, post-apply bake) on a 150 μm proximity-gap plate and then rapidly cooled to room temperature to give a film thickness of 4200 Å. Then the film was exposed using a resolution-test pattern on a GCA 0.60 NA ArF (193 nm) wafer stepper at a partial coherence setting of 0.70. Immediately afterwards, the film was baked (PEB, post-exposure bake) on a 150 μm proximity-gap plate, and then rapidly cooled to room temperature. Immediately afterwards the film was developed using an industry-standard 60 second track-single-puddle process with industry standard 0.26 N tetramethylammonium hydroxide developer.

TABLE 7

Results from lithographic testing of the resist compositions on ARC ResL refers to the resolution at Es. PAB and PEB are given in units of ° C. and ResL is in units of nm. DUV-18J is a commercial ARC product available from Brewer Sciences Incorporated of Missouri, and AR2 is a commercial ARC product available from Shipley Company of Massachusetts.

| Example | ARC of Example | Resist of Example | PAB | PEB | ResL | Resist Profile Comments |
|---|---|---|---|---|---|---|
| 44-comp | DUV 18J | 41 | 140 | 155 | >160 | bad summing; flaring |
| 45-comp | AR2 | 41 | 140 | 155 | N/A | resist adhesion failure |
| 46 | 10 | 41 | 140 | 155 | 150 | good edge acuity |
| 47 | 11 | 41 | 140 | 155 | 150 | good edge acuity |
| 48 | 12 | 41 | 140 | 155 | 150 | good edge acuity |
| 49 | 13 | 42 | 140 | 150 | 140 | good edge acuity |
| 50 | 16 | 41 | 140 | 155 | 150 | slight scumming |
| 51 | 19 | 41 | 140 | 155 | 150 | slight scumming |
| 52 | 20 | 41 | 140 | 155 | 150 | very slight scumming |
| 53 | 21 | 41 | 140 | 155 | 150 | good edge acuity |
| 54 | 22 | 41 | 140 | 155 | 150 | very slight "pinch" |
| 55 | 23 | 41 | 140 | 155 | 150 | slight "pinch" |
| 56-comp | 24 | 41 | 140 | 155 | 160 | flaring and scumming |
| 57-comp | 25 | 41 | 140 | 155 | 155 | flaring and scumming |
| 58 | 26 | 41 | 140 | 155 | 150 | good edge acuity |
| 59 | 27 | 41 | 140 | 155 | 150 | good edge acuity |
| 60 | 28 | 41 | 140 | 155 | 150 | good edge acuity |
| 61 | 29 | 41 | 140 | 155 | 150 | good edge acuity |
| 62 | 30 | 41 | 140 | 155 | 150 | good edge acuity |
| 63 | 31 | 41 | 140 | 155 | 150 | good edge acuity |
| 64 | 32 | 41 | 140 | 155 | 150 | good edge acuity |

DISCUSSION OF EXAMPLES 17–32

The compositions of this invention can yield remarkably high-performance ARCs suitable for semiconductor manufacturing applications. The quality of the interface between the resist pattern and the ARC underlayer is sharper and more free of residues, and the resolution capability of the ARC compositions 46–49, 53 and 58–61 exceed the resolution capability of current ARC materials DUV-18J and AR2. The performance of ARC compositions 46–49, 53 and 58–61 also exceed the performance of comparison Examples 56 and 57. Superior performance in compositions 46–49, 53 and 58–61 also illustrate that best results are obtained when the polymers do not contain alkyl spacer group structures between the polymer chain and the phenyl chromophores (for example phenethyl methacrylate in Example 56, and benzyl methacrylate in Example 57).

EXAMPLE 65

Testing of reflection control. A primary purpose of the use of an ARC in a lithographic process is to minimize the resist "swing curve"; i.e. minimize the variation in observed photospeed as the resist film thickness is changed. In order to evaluate reflection control, the resist of Example 49 was lithographically processed on the ARC of Example 13 by a process similar to that of Examples 44–64, except that the ARC film thickness was maintained at 82.5 nm and the thickness of the resist film was varied from 400 nm to 500 nm by changing the resist spin-coating speed. Photospeed to clear (Eo) was measured, and the data are shown below in Table 8:

TABLE 8

Observed resist photospeed, Eo vs resist film thickness on ARC of Example 13

| Resist film thickness (nm) | Photospeed to clear, Eo (mJ/cm$^2$) |
|---|---|
| 402 | 7.8 |
| 412 | 7.7 |
| 423 | 7.5 |
| 429 | 7.5 |
| 463 | 8.0 |
| 471 | 7.9 |
| 492 | 7.8 |

The maximum amplitude in the variation of observed Eo is 8.0−7.5=0.5 mJ/$^2$. This is a very small variation in photospeed to clear and is acceptable for most modern lithographic processes. This small value illustrates that the compositions of this invention are effective in control of reflection of light from the substrate during exposure at 193 nm.

The foregoing description of the invention is merely illustrative thereof, and it is understood that variations and modifications can be effected without departing from the scope or spirit of the invention as set forth in the following claims.

What is claimed is:

1. A method for forming a photoresist relief image comprising:
   (a) applying on a substrate a layer of an antireflective composition that comprises an acid or acid generator compound and a resin that has phenyl groups;
   (b) thermally curing the antireflective composition layer;
   (c) applying a layer of a photoresist composition over the antireflective composition;
   (d) exposing the photoresist layer to radiation having a wavelength of below about 200 nm and developing the exposed photoresist layer.

2. The method of claim 1 wherein the photoresist layer is exposed with radiation having a wavelength of about 193 nm.

3. The method of claim 1 wherein the antireflective composition comprises a crosslinker.

4. The method of claim 3 wherein the antireflective composition layer is thermally cured prior to applying the photoresist composition.

5. The method of claim 1 wherein the antireflective composition comprises a photoacid generator, and the photoacid generator is not substantially activated until the exposing of the photoresist composition layer.

6. The method of claim 1 wherein the antireflective composition comprises a thermal acid generator compound.

7. The method of claim 1 wherein the photoresist is a chemically amplified positive-acting photoresist.

8. A method for forming a photoresist relief image comprising:
   (a) applying on a substrate a layer of an antireflective composition that comprises an acid or thermal acid generator compound and a resin that has phenyl groups;
   (b) applying a layer of a photoresist composition above the antireflective composition;
   (c) exposing the photoresist layer to radiation having a wavelength of below about 200 nm and developing the exposed photoresist layer.

9. The method of claim 8 wherein the photoresist layer is exposed with radiation having a wavelength of about 193 nm.

10. The method of claim 8 wherein the antireflective composition comprises a crosslinker.

11. The method of claim 8 wherein the antireflective composition layer is thermally cured prior to applying the photoresist composition.

12. The method of claim 8 wherein the antireflective composition comprises a photoacid generator, and the photoacid generator is not substantially activated until the exposing of the photoresist composition layer.

13. The method of claim 8 wherein the antireflective composition comprises a thermal acid generator compound.

14. The method of claim 8 wherein the photoresist is a chemically amplified positive-acting photoresist.

15. An article of manufacture comprising:
   a substrate;
   an antireflective composition on the substrate, the antireflective composition comprising an acid or acid generator compound and a resin that has phenyl groups;
   a layer of a photoresist composition over the antireflective composition, the photoresist composition designed for imaging with radiation having a wavelength below 200 nm.

16. The article of claim 15 wherein the antireflective composition comprises a crosslinker.

17. The article of claim 15 wherein the antireflective composition layer is thermally cured.

18. The article of claim 15 wherein the photoresist composition is designed for imaging with radiation having a wavelength of 193 nm.

19. The article of claim 15 wherein the photoresist is a chemically amplified positive-acting photoresist.

* * * * *